United States Patent
Hao et al.

(10) Patent No.: US 9,618,800 B2
(45) Date of Patent: Apr. 11, 2017

(54) METHOD FOR PRODUCING SPACER IN LIQUID CRYSTAL PANEL AND LIQUID CRYSTAL PANEL OBTAINED THEREBY

(71) Applicant: SHENZHEN CHINA STAR OPTOELECTRONICS TECHNOLOGY CO., LTD., Shenzhen, Guangdong (CN)

(72) Inventors: Sikun Hao, Shenzhen (CN); Yuzhi Wu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/241,786

(22) PCT Filed: Jan. 17, 2014

(86) PCT No.: PCT/CN2014/070751
§ 371 (c)(1),
(2) Date: Feb. 27, 2014

(87) PCT Pub. No.: WO2015/018186
PCT Pub. Date: Feb. 12, 2015

(65) Prior Publication Data
US 2015/0268501 A1    Sep. 24, 2015

(30) Foreign Application Priority Data
Aug. 9, 2013    (CN) .......................... 2013 1 0348182

(51) Int. Cl.
*G02F 1/1339* (2006.01)
*G02F 1/1343* (2006.01)
*H01L 27/12* (2006.01)

(52) U.S. Cl.
CPC ....... *G02F 1/13394* (2013.01); *G02F 1/13439* (2013.01); *H01L 27/1262* (2013.01); *G02F 2001/13396* (2013.01)

(58) Field of Classification Search
CPC ............. G02F 1/13394; G02F 1/13439; G02F 2001/13396; H01L 27/1262
(Continued)

(56) References Cited

U.S. PATENT DOCUMENTS

| 2007/0002265 A1* | 1/2007 | Kwak | ................. | G02F 1/13392 349/156 |
| 2008/0036958 A1* | 2/2008 | Su | ....................... | G02F 1/13394 349/155 |

(Continued)

FOREIGN PATENT DOCUMENTS

| CN | 1713044 A | 12/2005 |
| CN | 1892382 A | 1/2007 |

(Continued)

OTHER PUBLICATIONS

International Search Report dated May 16, 2014, issued to PCT/CN2014/070751.

*Primary Examiner* — Charles Chang
(74) *Attorney, Agent, or Firm* — Stein IP, LLC

(57) ABSTRACT

The present disclosure provides a method for producing spacers in a liquid crystal panel, comprising: (a) exposing a material layer adjacent to a side of a thin film transistor substrate of said liquid crystal panel by a mask with a pre-set pattern, in order to form a groove in said material layer, wherein the exposure energy of said exposure ranges from 10 to 100 mJ/cm2; (b) forming a main spacer and a side spacer in an opposite substrate, wherein the height of the side spacer is higher than that of the main spacer; and (c) assembling a TFT substrate and the opposite substrate together, such that the main spacer of the opposite substrate (Continued)

abuts against the TFT substrate, and the side spacer extends into said groove. The present disclosure also provides a liquid crystal panel obtained by said method.

12 Claims, 3 Drawing Sheets

(58) Field of Classification Search
USPC .................................................. 349/155–157
See application file for complete search history.

(56) References Cited

U.S. PATENT DOCUMENTS

| | | | | |
|---|---|---|---|---|
| 2009/0122242 | A1* | 5/2009 | Nakamura | ........ G02F 1/133512 349/110 |
| 2011/0013131 | A1 | 1/2011 | Tanaka et al. | ................ 349/155 |
| 2012/0287026 | A1* | 11/2012 | Masuda | .............. H01L 27/3272 345/76 |
| 2013/0021552 | A1* | 1/2013 | Tomioka | ............. G02F 1/13392 349/43 |
| 2013/0100385 | A1* | 4/2013 | Hou | .................. G02F 1/133512 349/106 |

FOREIGN PATENT DOCUMENTS

| | | |
|---|---|---|
| CN | 101592827 A | 12/2009 |
| CN | 101957519 A | 1/2011 |
| CN | 102736311 A | 10/2012 |
| CN | 202512327 U | 10/2012 |
| CN | 103454812 A | 12/2013 |

* cited by examiner

METHOD FOR PRODUCING SPACER IN LIQUID CRYSTAL PANEL AND LIQUID CRYSTAL PANEL OBTAINED THEREBY

FIELD OF THE INVENTION

The present disclosure relates to the field of manufacturing of a liquid crystal panel, particularly to a method of producing a spacer in the liquid crystal panel and a liquid crystal panel obtained thereby.

BACKGROUND OF THE INVENTION

A liquid crystal display (LCD), with the advantages of high display quality, low costs, portability and the like, is the most widely used flat panel display at present. With a high resolution color screen, the liquid crystal display has gradually become a widely used display of various electronic devices, such as mobile phones, personal digital assistants (PDA), digital cameras, computers or laptops.

A currently widely used LCD generally consists of an upper substrate, a lower substrate and a middle layer of liquid crystals, wherein the substrates each comprise a glass plate, electrodes, and so on. Moreover, a conventional LCD panel includes a color filter substrate, a thin film transistor (TFT) array substrate, and a liquid crystal layer configured therebetween.

In recent years, techniques are further proposed, wherein a color filter layer is directly integrated on a TFT substrate ("Color Filter on Array"; COA or TFT array substrate), or a black matrix layer is arranged on a TFT substrate ("Black Matrix on Array; BOA). In addition, a fringe field switching (FFS) technique is also proposed, wherein, for example, a COA substrate (or a BOA substrate) is assembled with an opposite substrate without a color filter layer or a black matrix layer, and then liquid crystal molecules are filled into the space between the two substrates to form an LCD panel. Since the color filter layer forms merely on the TFT substrate directly, no alignment errors will be generated. Moreover, this LCD panel has better resolution and higher aperture ratio of pixels.

Generally, spacers are arranged between the two substrates of an LCD panel. The spacers are mainly used to maintain the distance between the upper and lower substrates of the LCD, so as to provide a certain space for filling liquid crystals. Currently, said spacers are mainly placed between said two substrates in a dispersed manner. However, contrast, resolution and viewing angles of the LCD will be negatively influenced if the spacers are dispersed inappropriately. In particular, with the enlargement of LCD panels, even distribution of spacers has become more and more important.

There are two traditional methods for providing spacers: one is using uniform spacers (as shown in FIG. 1), while the other is using hybrid spacers (as shown in FIG. 2), i.e. creating side spacers through weak exposure.

According to the first method, all spacers have the same height. The advantages of this type of spacers are of larger taper angles, narrower width of black matrix, and higher aperture ratio and penetration ratio, while the disadvantage thereof is that the liquid crystal margin is limited due to spacers of one single height.

According to the second method, all spacers have different heights. As spacers include higher main spacers and lower side spacers, this method enables a larger liquid crystal margin (as shown in FIG. 2), while the disadvantages thereof are smaller taper angle and wider width for the side spacers formed, and larger coverage width of the required black matrix, which will affect the aperture ratio and penetration ratio, or increase cost.

SUMMARY OF THE INVENTION

The present disclosure aims to provide a method of forming spacers in a liquid crystal panel, so as to solve problems that exist in the prior art.

To realize the above object, the present disclosure provides the following technical solutions.

(1) The present disclosure provides a method of producing spacers in a liquid crystal panel, comprising the following steps:

(a) exposing a material layer adjacent to a side of a thin film transistor (TFT) substrate of said liquid crystal panel by a mask with a pre-set pattern, in order to form a groove in said material layer, wherein the exposure energy of said exposure ranges from 10 to 100 mJ/cm$^2$;

(b) forming a main spacer and a side spacer in an opposite substrate, wherein the height of the side spacer is higher than that of the main spacer; and (c) assembling a TFT substrate and the opposite substrate together, such that the main spacer of the opposite substrate abuts against the TFT substrate and the side spacer thereof extends into said groove.

(2) In one preferred embodiment according to technical solution (1) of the present disclosure, the exposure energy of said exposure ranges from 20 to 80 mJ/cm$^2$.

(3) In one preferred embodiment according to technical solution (1) or (2) of the present disclosure, the material layer on the side of said TFT substrate is a color film layer or an organic protective layer.

(4) In one preferred embodiment according to any one of technical solutions (1) to (3) of the present disclosure, a layer of ITO pixel electrodes is further provided on said material layer where the groove is formed.

(5) In one preferred embodiment according to any one of technical solutions (1) to (4) of the present disclosure, the height of said main spacer is in the range from 1 to 5 μm.

(6) In one preferred embodiment according to any one of technical solutions (1) to (5) of the present disclosure, the height of said side spacer is in the range from 1 to 5 μm.

(7) In one preferred embodiment according to any one of technical solutions (1) to (6) of the present disclosure, the height of said side spacer is 0.1 to 1 μm higher than that of said main spacer.

(8) In one preferred embodiment according to any one of technical solutions (1) to (7) of the present disclosure, the pattern of the mask used in the exposure of step (a) is in the form of stripes, concentric circles, a dart board, an perforated plate, a chessboard, a crisscross, concentric squares, or zigzag stripes.

The pattern of the mask used in the present disclosure can be any other pattern, such as stripes, a dart board, and a crisscross, etc.

(9) A liquid crystal panel obtained by the method according to any one of technical solutions (1) to (8) of the present disclosure is further provided, wherein a groove is arranged on the material layer on the side of the TFT substrate of said liquid crystal panel, and a main spacer and a side spacer are arranged on the opposite substrate, wherein said side spacer extends into said groove.

The beneficial effects of the present invention are as follows. The spacers obtained by the method of the present disclosure in an LCD panel can increase the liquid crystal margin. Meanwhile, as the width of the side spacer is decreased, the width of the black matrix can be decreased accordingly, and the ratio of penetration can be increased. The groove is formed at said substrate through exposure. The exposure energy of said exposure ranges from 10 to 100 mJ/cm$^2$, preferably 20 to 80 mJ/cm$^2$, such as 50 mJ/cm$^2$. The groove obtained thereby, after the spacer is arranged therein, can achieve the best ratio of penetration and display effects.

DETAILED DESCRIPTION OF THE EMBODIMENTS

The present disclosure will be discussed in detail below with reference to drawings and examples. However, it should be understood that the scope of the present disclosure is not limited to the examples below; it is intended to cover alternatives, various modifications and equivalents within the scope and spirit of the present disclosure. In particular, as long as there is no structural conflict, the technical features mentioned in the examples can be combined in any way.

Example 1

Figure 1:
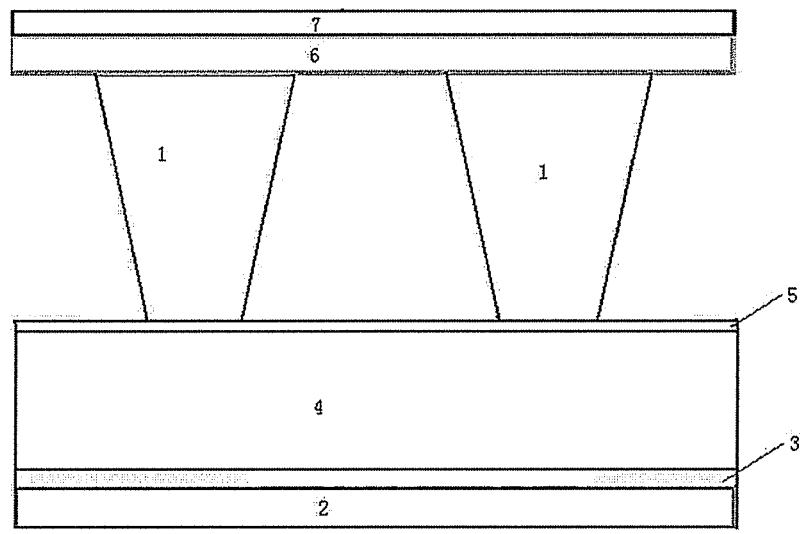
FIG. 1 schematically shows the structure of an LCD panel with uniform spacers in the prior art.
Figure 2:
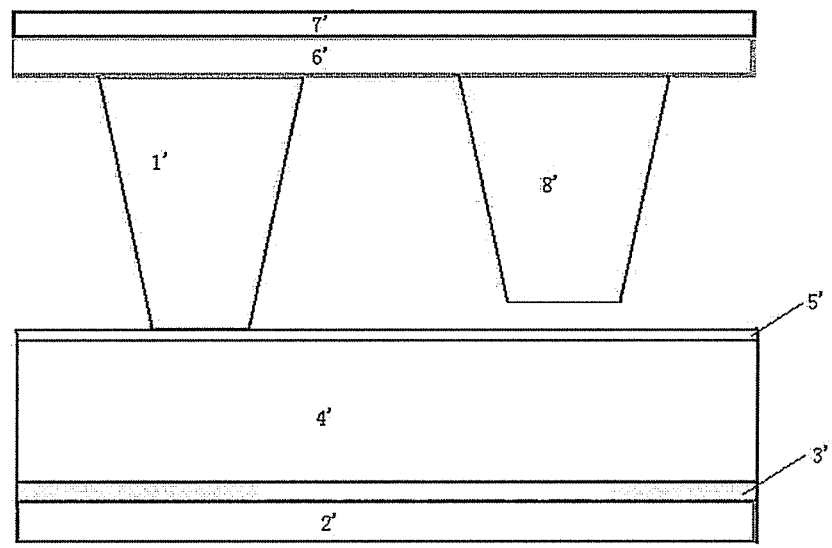
FIG. 2 schematically shows the structure of an LCD panel with hybrid spacers in the prior art.
Figure 3:
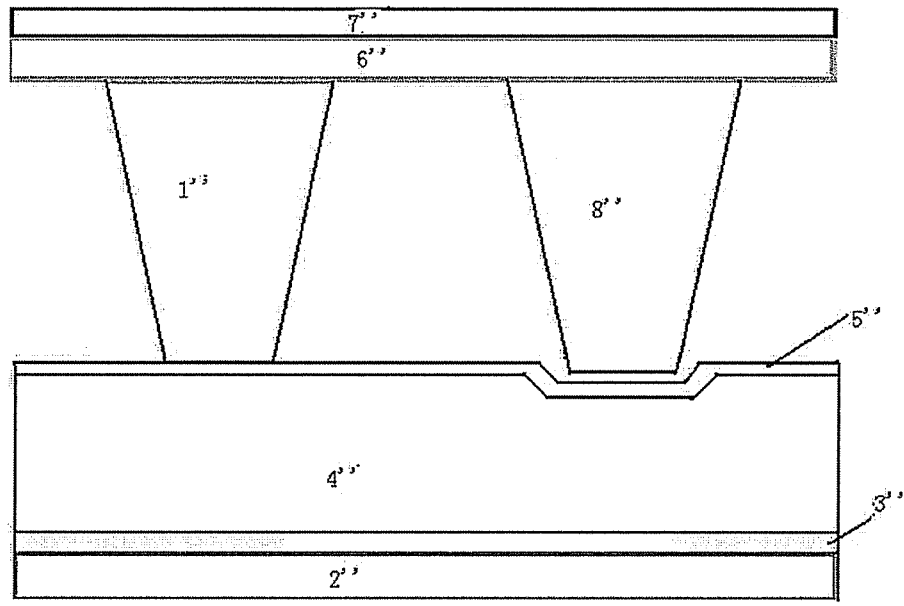
FIG. 3 schematically shows the structure of spacers in one embodiment of the present disclosure.

Take a COA panel as an example. As shown in FIG. 3, the method of producing spacers in the liquid crystal panel of the present disclosure comprises the following steps:

a) exposing a color film 4" of said LCD panel by a mask with a pre-set pattern, so as to form a groove on said color film, the exposure energy of said exposure being 10 mJ/cm$^2$;

b) forming a main spacer 1" and a side spacer 8" in an opposite substrate (i.e. black matrix substrate), wherein the height of the side spacer 8" is higher than that of the main spacer 1"; and c) assembling a TFT substrate and the opposite substrate together, such that the main spacer of the opposite substrate abuts against the TFT substrate, and the side spacer 8" extends into the groove on the color film 4", wherein a layer of ITO pixel electrodes is further provided on said color film formed, the height of said side spacer being 0.5 μm higher than that of said main spacer and the pattern of the mask used having an outer contour in the form of squared stripes.

In a display panel having said spacers obtained by the method of the present example, the liquid crystal margin, the width of the black matrix, and the ratio of penetration are all increased. In particular, the ratio of penetration is increased by 10 to 20%.

Example 2

Figure 4:
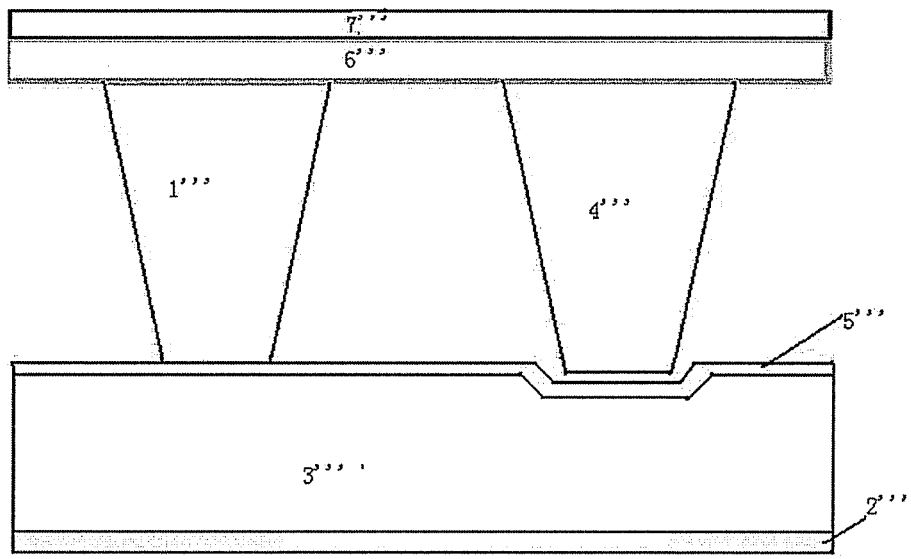
FIG. 4 schematically shows the structure of spacers in another embodiment of the present disclosure.
Figure 5:
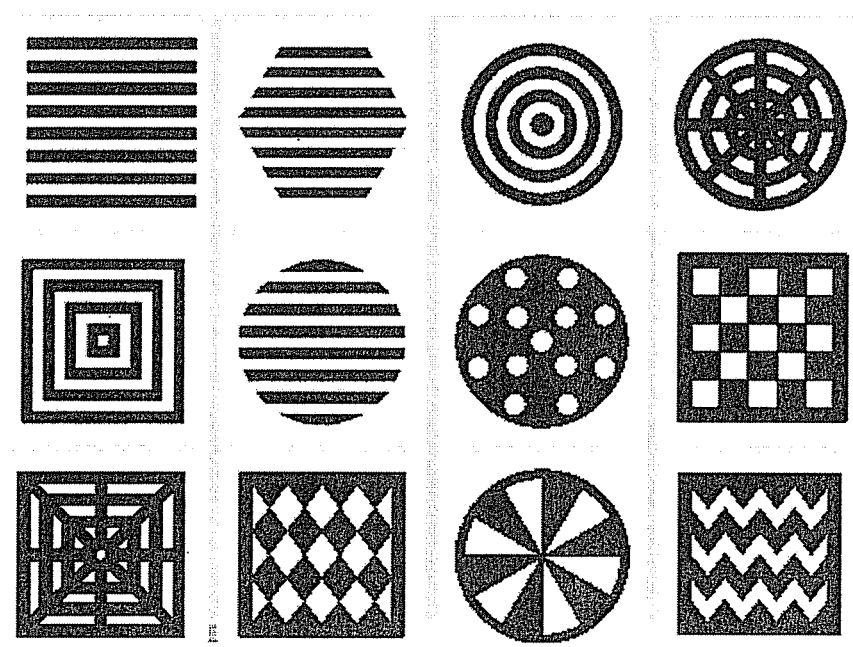
FIG. 5 shows various patterns suitable for the mask used in the present disclosure.

Take an FFS panel as an example. As shown in FIG. 4, the method of producing spacers in the liquid crystal panel of the present disclosure comprises the following steps:

a) exposing an organic protective layer 3''' of said LCD panel by a mask with a pre-set pattern, so as to form a groove on said organic protective layer, the exposure energy of said exposure being 100 mJ/cm$^2$;

b) forming a main spacer 1''' and a side spacer 4''' in an opposite substrate (i.e. organic conducting substrate), wherein the height of the side spacer 4''' is higher than that of the main spacer 1'''; and c) assembling a TFT substrate and the opposite substrate together, such that the main spacer of the opposite substrate abuts against the TFT substrate, and the side spacer 4''' extends into the groove on the organic protective layer 3''', wherein a layer of ITO pixel electrodes is further provided on said organic protective layer, the height of said side spacer being 1 μm higher than that of said main spacer and the pattern of the mask used being in the form of a dart board.

In a display panel having said spacer obtained by the method of the present example, the liquid crystal margin, the width of the black matrix, and the ratio of penetration are all increased. In particular, the ratio of penetration is increased by 10 to 20%.

Example 3

Take a COA panel as an example. As shown in FIG. 3, the method of producing spacers in the liquid crystal panel of the present disclosure comprises the following steps:

a) exposing a color film 4" of said LCD panel by a mask with a pre-set pattern, so as to form a groove on said color film, the exposure energy of said exposure being 20 mJ/cm$^2$;

b) forming a main spacer 1" and a side spacer 8" in an opposite substrate (i.e. black matrix substrate), wherein the height of the side spacer 8" is higher than that of the main spacer 1"; and c) assembling a TFT substrate and the opposite substrate together, such that the main spacer of the opposite substrate abuts against the TFT substrate, and the side spacer 8" extends into the groove on color film 4", wherein a layer of ITO pixel electrodes is further provided on said color film formed, the height of said side spacer being 0.5 μm higher than that of said main spacer and the pattern of the mask used being in the form of zigzag stripes.

In a display panel having said spacer obtained by the method of the present example, the liquid crystal margin, the width of the black matrix, and the ratio of penetration are all increased. In particular, the ratio of penetration is increased by 10 to 20%.

Example 4

Take a COA panel as an example. As shown in FIG. 3, the method of producing spacers in the liquid crystal panel of the present disclosure comprises the following steps:

a) exposing a color film 4" of said LCD panel by a mask with a pre-set pattern, so as to form a groove on said color film, the exposure energy of said exposure being 80 mJ/cm$^2$;

b) forming a main spacer 1" and a side spacer 8" in an opposite substrate (i.e. black matrix substrate), wherein the height of the side spacer 8" is higher than that of the main spacer 1"; and c) assembling a TFT substrate and the opposite substrate together, such that the main spacer of the opposite substrate abuts against the TFT substrate, and the side spacer 8" extends into the groove on the color film 4", wherein a layer of ITO pixel electrodes is further provided on said color film formed, the height of said side spacer being 0.5 μm higher than that of said main spacer and the pattern of the mask used having an outer contour in the form of perforated plate.

In a display panel having said spacer obtained by the method of the present example, the liquid crystal margin, the width of the black matrix, and the ratio of penetration are all increased. In particular, the ratio of penetration is increased by 10 to 20%.

Example 5

Take an FFS panel as an example. As shown in FIG. 4, the method of producing spacers in the liquid crystal panel of the present disclosure comprises the following steps:

a) exposing an organic protective layer 3''' of said LCD panel by a mask with a pre-set pattern, so as to form a groove on said organic protective layer, the exposure energy of said exposure being 50 mJ/cm$^2$;

b) forming a main spacer 1''' and a side spacer 4''' in an opposite substrate (i.e. organic conducting substrate), wherein the height of the side spacer 4''' is higher than that of the main spacer 1'''; and c) assembling a TFT substrate and the opposite substrate together, such that the main spacer of the opposite substrate abuts against the TFT substrate, and the side spacer 4''' extends into the groove on the organic protective layer 3''', wherein a layer of ITO pixel electrodes is further provided on said organic protective layer, the height of said side spacer being 1 μm higher than that of said main spacer and the pattern of the mask used being in the form of a chessboard.

In a display panel having said spacer obtained by the method of the present example, the liquid crystal margin, the width of the black matrix, and the ratio of penetration are all increased. In particular, the ratio of penetration is increased by 10 to 20%.

LIST OF REFERENCE SIGNS 1 spacer
2 glass substrate
3 TFT
4 color film
5 pixel electrode
6 organic conducting layer
7 black matrix
1' main spacer
2' glass substrate
3' TFT
4' color film
5' pixel electrode
6' organic conducting layer
7' black matrix
8' side spacer
1'' main spacer
2'' glass substrate
3'' TFT
4'' color film
5'' pixel electrode
6'' organic conducting layer
7'' black matrix
8'' side spacer
1''' main spacer
2''' glass substrate
3''' organic protective layer
4''' side spacer
5''' pixel electrode
6''' organic conducting layer.

The invention claimed is:

1. A method for producing spacers in a liquid crystal panel, comprising the following steps:
   (a) exposing a material layer adjacent to a side of a thin film transistor (TFT) substrate of said liquid crystal panel by a mask with a pre-set pattern, to form a groove in said material layer, wherein the material layer on the side of said TFT substrate being a color film layer or an organic protective layer and an exposure energy of said exposure ranges from 10 to 100 mJ/cm2;
   (b) forming a main spacer and a side spacer in an opposite substrate, wherein the height of the side spacer is higher than that of the main spacer; and
   (c) assembling said TFT substrate and the opposite substrate together, such that the main spacer of the opposite substrate abuts against the TFT substrate and the side spacer extends into said groove; wherein:
   a layer of ITO pixel electrodes is further provided on said material layer where the groove is formed, and
   the opposite substrate is provided with a black matrix on an outside surface thereof so that the main spacer and the side spacer are separated from the black matrix.

2. The method according to claim 1, wherein the exposure energy of said exposure ranges from 20 to 80 mJ/cm2.

3. The method according to claim 2, wherein a layer of ITO pixel electrodes is further provided on said material layer where the groove is formed.

4. The method according to claim 1, wherein the height of said main spacer is in the range from 1 to 5 μm.

5. The method according to claim 2, wherein the height of said main spacer is in the range from 1 to 5 μm.

6. The method according to claim 1, wherein the height of said side spacer is in the range from 1 to 5 μm.

7. The method according to claim 2, wherein the height of said side spacer is in the range from 1 to 5 μm.

8. The method according to claim 1, wherein the height of said side spacer is 0.1 to 1 μm higher than that of said main spacer.

9. The method according to claim 2, wherein the height of said side spacer is 0.1 to 1 μm higher than that of said main spacer.

10. The method according to claim 1, wherein the pattern of the mask used in exposure in said step (a) is in the form of stripes, concentric circles, a dart board, an perforated plate, a chessboard, a crisscross, concentric squares, or zigzag stripes.

11. The method according to claim 2, wherein the pattern of the mask used in exposure in said step (a) is in the form of stripes, concentric circles, a dart board, an perforated plate, a chessboard, a crisscross, concentric squares, or zigzag stripes.

12. A liquid crystal panel obtained by the method according to claim 1, wherein the groove is provided on the material layer at the side of the TFT substrate of said liquid crystal panel, and the main spacer and the side spacer are provided on the opposite substrate, wherein said side spacer extends into said groove.

* * * * *